US011221372B2

(12) United States Patent
Mitsui et al.

(10) Patent No.: US 11,221,372 B2
(45) Date of Patent: Jan. 11, 2022

(54) BATTERY PERFORMANCE EVALUATION DEVICE, AND BATTERY PERFORMANCE EVALUATION METHOD

(71) Applicant: TOYOTA JIDOSHA KABUSHIKI KAISHA, Toyota (JP)

(72) Inventors: Masahiko Mitsui, Toyota (JP); Junta Izumi, Nagoya (JP); Juni Yasoshima, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 111 days.

(21) Appl. No.: 16/722,473

(22) Filed: Dec. 20, 2019

(65) Prior Publication Data

US 2020/0209319 A1 Jul. 2, 2020

(30) Foreign Application Priority Data

Dec. 26, 2018 (JP) .............................. JP2018-243293

(51) Int. Cl.
*G01R 31/389* (2019.01)
*G01R 31/3842* (2019.01)
(Continued)

(52) U.S. Cl.
CPC ............ *G01R 31/389* (2019.01); *B60L 58/12* (2019.02); *G01R 31/367* (2019.01);
(Continued)

(58) Field of Classification Search
CPC .............. G01R 31/389; G01R 31/3842; G01R 31/367; G01R 31/396; G01R 31/392;
(Continued)

(56) References Cited

U.S. PATENT DOCUMENTS 5,241,275 A     8/1993    Fang
6,037,777 A *   3/2000    Champlin ............ G01R 31/367
                                                      324/430
(Continued)

FOREIGN PATENT DOCUMENTS

CN            103091642 A     5/2013
DE      102016206538 A1 * 10/2017     ............ H01M 10/48
(Continued)

OTHER PUBLICATIONS

M. Galeotti, C. Giammanco, L. Cinà, S. Cordiner and A. Di Carlo, "Diagnostic methods for the evaluation of the state of health (SOH) of NiMH batteries through electrochemical impedance spectroscopy," 2014 IEEE 23rd International Symposium on Industrial Electronics (ISIE), 2014, pp. 1641-1646 (Year: 2014).*

(Continued)

*Primary Examiner* — Daniel R Miller
(74) *Attorney, Agent, or Firm* — Sughrue Mion, PLLC

(57) ABSTRACT

A battery performance evaluation device executes an alternating current impedance acquiring process (S1), an OCV acquiring process (S2), and an SOC estimating process (S3). The alternating current impedance acquiring process involves acquiring a measurement result of an alternating current impedance of a target secondary battery, the alternating current impedance measured by applying an application signal to the target secondary battery within a specific frequency range. The OCV acquiring process involves acquiring an OCV of the target secondary battery. The SOC estimating process involves estimating an SOC of the target secondary battery to be 0%, if an imaginary component of the measurement result of the acquired alternating current (Continued)

impedance at a predetermined frequency within the specific frequency range is greater than or equal to a first threshold value and the acquired OCV value is less than or equal to a second threshold value.

5 Claims, 12 Drawing Sheets

(51) Int. Cl.
*G01R 31/367* (2019.01)
*G01R 31/396* (2019.01)
*B60L 58/12* (2019.01)
*H01M 10/42* (2006.01)
*G01R 31/392* (2019.01)
*G06N 3/08* (2006.01)

(52) U.S. Cl.
CPC ....... *G01R 31/3842* (2019.01); *G01R 31/392* (2019.01); *G01R 31/396* (2019.01); *G06N 3/08* (2013.01); *H01M 10/425* (2013.01); *H01M 2010/4271* (2013.01)

(58) Field of Classification Search
CPC ..... G01R 31/387; G01R 31/382; B60L 58/12; B60L 2260/44; B60L 2260/46; G06N 3/08; H01M 10/425; H01M 2010/4271; H01M 10/44; H01M 10/4285; H01M 10/42; H01M 10/54; H01M 2220/20; Y02W 30/84; Y02E 60/10; Y02T 10/70
See application file for complete search history.

(56) References Cited

U.S. PATENT DOCUMENTS

| | | | |
|---|---|---|---|
| 2012/0078552 A1* | 3/2012 | Mingant | G01R 31/367 702/63 |
| 2018/0203073 A1* | 7/2018 | Christensen | G01N 27/26 |
| 2020/0033414 A1 | 1/2020 | Izumi et al. | |
| 2020/0041570 A1 | 2/2020 | Izumi et al. | |
| 2020/0153264 A1* | 5/2020 | Osada | B60L 58/16 |

FOREIGN PATENT DOCUMENTS

| | | |
|---|---|---|
| JP | 2003-317810 A | 11/2003 |
| JP | 2018-146441 A | 9/2018 |
| JP | 2020-20604 A | 2/2020 |
| JP | 2020-21592 A | 2/2020 |

OTHER PUBLICATIONS

H. Rathmann et al., "Novel method of state-of-charge estimation using in-situ impedance measurement:" IECON 2014—40th Annual Conference of the IEEE Industrial Electronics Society, 2014, pp. 2192-2198 (Year: 2014).*

* cited by examiner

BATTERY PERFORMANCE EVALUATION DEVICE, AND BATTERY PERFORMANCE EVALUATION METHOD

CROSS REFERENCE TO RELATED APPLICATIONS

The present application claims priority from Japanese Patent Application No. 2018-243293 filed on Dec. 26, 2018, which is incorporated by reference herein in its entirety.

BACKGROUND

The present disclosure relates to a battery performance evaluation device and a battery performance evaluation method for evaluating performance characteristics of secondary batteries.

Secondary batteries are widely used as a portable power source for various devices such as personal computers and mobile terminals, and as a vehicle power source for various vehicles such as electric vehicles (EVs), hybrid vehicles (HVs), and plug-in hybrid vehicles (PHVs). The secondary batteries that have been used onboard the vehicles may be removed and collected. It is desirable that, if usable, the collected secondary batteries be reused. However, secondary batteries can deteriorate over time and repeated charging and discharging. The degree of deterioration in secondary batteries is different from one battery to another. For this reason, it is desirable that the performance of each of the collected secondary batteries should be evaluated, and according to the results of the evaluation, the policy on how to reuse each of the secondary batteries should be determined. In addition, not only in determining the policy on how to reuse collected secondary batteries, it is desirable to evaluate the performance of a secondary battery in many cases.

Various techniques have been proposed for evaluating performance and characteristics of secondary batteries. For example, JP 2003-317810 A proposes a method of evaluating battery characteristics that involves determining the presence or absence of micro-short circuit in a secondary battery, based on a reaction resistance value of the secondary battery that is acquired by an alternating current impedance measurement method.

SUMMARY

When evaluating the performance or characteristics of a secondary battery using the alternating current impedance measurement method, the process is simplified if alternating current impedance can be measured without adjusting the state of charge (SOC) of the secondary battery. However, when the adjustment of SOC is eliminated, the secondary batteries that show an SOC of 0% because of some kind of defects (such as the presence of micro-short circuit) are also included in the targets of the performance evaluation. This may reduce the accuracy of the performance evaluation.

In one embodiment, a battery performance evaluation device disclosed herein is configured or programmed to execute: an alternating current impedance acquiring process of acquiring a measurement result of an alternating current impedance of a target secondary battery, the alternating current impedance measured by applying an application signal to the target secondary battery within a specific frequency range; an open circuit voltage (OCV) acquiring process of acquiring an OCV of the target secondary battery; and a state of charge (SOC) estimating process of estimating an SOC of the target secondary battery to be 0%, if an imaginary component of the measurement result of the acquired alternating current impedance at a predetermined frequency within the specific frequency range is greater than or equal to a first threshold value and the acquired OCV value is less than or equal to a second threshold value.

The inventors of the present application have discovered that at least one of the value of the imaginary component of the alternating current impedance at a predetermined frequency and the value of the OCV is likely to be different between a secondary battery having an SOC of 0% and a secondary battery having an SOC of greater than 0%. More specifically, the inventors have found from experimental results that, unlike the secondary battery having an SOC of greater than 0%, the secondary battery having an SOC of 0% is likely to show an imaginary component of the alternating current impedance at the predetermined frequency that is greater than or equal to the first threshold value and an OCV value that is less than or equal to the second threshold value. The battery performance evaluation device according to the above-described embodiment estimates the SOC of a secondary battery to be 0% when the secondary battery has an imaginary component of the alternating current impedance at the predetermined frequency that is greater than or equal to the first threshold value and an OCV value that is less than or equal to the second threshold value. Therefore, it is possible to properly estimate whether the SOC of a secondary battery is 0% or not, even when the SOC is not adjusted in the measurement of the alternating current impedance of the secondary battery. Thus, the performance of the secondary battery is evaluated more appropriately.

Note that the first threshold value to be compared with the imaginary component of the alternating current impedance and the second threshold value to be compared with the SOC value can vary depending on conditions such as the type of the secondary battery, whether or not the secondary battery is a battery pack, and the structure of the battery pack if the secondary battery is a battery pack. Accordingly, the first threshold value and the second threshold value may be determined as appropriate through experimentation, depending on the conditions such as the type of the secondary battery and so forth.

In another embodiment of the battery performance evaluation device disclosed herein, the predetermined frequency of the imaginary component of the alternating current impedance that is to be compared with the first threshold value may be contained within a predetermined low frequency range of the application signal.

The inventors of the present disclosure found that there is a tendency that when the SOC of a secondary battery is 0%, the imaginary component of the alternating current impedance, particularly, the imaginary component in a low frequency, is greater than or equal to the first threshold value. Therefore, it is possible to estimate whether the SOC is 0% or not by comparing the imaginary component of the alternating current impedance in a low frequency range with the first threshold value. Either one imaginary component may be compared with the first threshold value, or a plurality of imaginary components may be compared with the first threshold value. For example, the imaginary component to be compared with the first threshold value may be an imaginary component at the lowest frequency in the frequency range of the application signal. However, as described above, in the frequency range of the application signal, the range of the predetermined frequency that corresponds to the imaginary component to be compared with the first threshold value may vary depending on the conditions such as the type of the secondary battery and so forth. In this case, the range of the predetermined frequency may be determined according to the conditions such as the type of the secondary battery and so forth.

In another embodiment of the present disclosure, the battery performance evaluation device may further execute a battery capacity estimating process. In the battery capacity estimating process, if the SOC of the target secondary battery is not estimated to be 0% by the SOC estimating process, the battery capacity of the target secondary battery is estimated based on the measurement result of the alternating current impedance of the target secondary battery.

In this case, after the secondary batteries that are estimated to have an SOC of 0% are excluded by the SOC estimating process, the battery capacity estimating process is executed based on the measurement result of the alternating current impedance. As a result, both the accuracy and efficiency of estimation of the battery capacity are improved.

In another embodiment of the battery performance evaluation device disclosed herein, the battery capacity estimating process obtains an estimation result of the battery capacity of the target secondary battery by inputting data based on a Nyquist plot of the target secondary battery into a pre-trained neural network model. The pre-trained neural network model performs learning using a plurality of training data including data based on a plurality of Nyquist plots indicating measurement results of alternating current impedance of a plurality of secondary batteries and actually measured battery capacities of the plurality of secondary batteries.

In this case, it is possible to acquire the estimation result of the battery capacity of the target secondary battery easily and appropriately by properly training the neural network model, without executing a complicated process (such as the process of analyzing the measurement results of alternating current impedance). It is also possible, however, to estimate the battery capacity based on other algorithms without using the neural network model.

In another embodiment of the battery performance evaluation device disclosed herein, the pre-trained neural network model is trained based on the training data of a plurality of secondary batteries having an SOC of greater than 0%, or a plurality of secondary batteries estimated to have an SOC of greater than 0%.

In this case, the neural network model is trained based on the training data from which the training data of the secondary batteries having an SOC of 0% or the secondary batteries estimated to have an SOC of 0% are excluded. Therefore, the pre-trained neural network model is optimized for estimation of the battery capacity of a secondary battery having an SOC of greater than 0%, in comparison with the case where the training data used for learning of the neural network model contain the training data of the secondary batteries having an SOC of 0%. As a result, the accuracy of estimation of the battery capacity is further improved.

When a secondary battery needs to be estimated whether to have an SOC of 0% or not in order to classify the secondary batteries used for obtaining the training data, the SOC may be estimated using the same algorithm as used for the above-described SOC estimating process. That is, it is possible to use training data of a secondary battery whose imaginary component of the alternating current impedance at a predetermined frequency within the frequency range of the application signal is less than the first threshold value and whose OCV value is greater than the second threshold value, for training the neural network model. In this case, it is also possible to eliminate the step of acquiring an actual measurement value of SOC of a secondary battery.

In another embodiment of the present disclosure, the battery performance evaluation device may further execute a classifying process. The classifying process involves classifying the target secondary battery into either a first group in which the battery capacity is within a reference range, or a second group in which the battery capacity is outside the reference range, based on at least one feature value extracted from a Nyquist plot indicating the measurement result of the alternating current impedance of the target secondary battery. The battery capacity estimating process is executed if the SOC of the target secondary battery is not estimated to be 0% by the SOC estimating process and the target secondary battery is classified into the first group by the classifying process.

The secondary batteries that show a battery capacity outside the reference range are highly likely to be deteriorated excessively. Therefore, after the secondary batteries that have a battery capacity outside the reference range are excluded, the battery capacity estimating process is executed based on the measurement result of the alternating current impedance. As a result, both the accuracy and efficiency of estimation of the battery capacity are improved.

When the battery capacity estimating process is executed using the pre-trained neural network model, the pre-trained neural network model may be trained based on the training data of a plurality of secondary batteries that have a battery capacity within the reference range. In that case, the pre-trained neural network model is optimized for estimation of the battery capacity of a secondary batteries that belong to the first group, in comparison with the case where the training data of the secondary batteries that belong to the second group are used for training. As a result, the accuracy of estimation of the battery capacity is further improved.

In another embodiment of the present disclosure, a battery performance evaluation method includes: an alternating current impedance acquiring step of acquiring a measurement result of an alternating current impedance of a target secondary battery, the alternating current impedance measured by applying an application signal to the target secondary battery within a specific frequency range; an open circuit voltage (OCV) acquiring step of acquiring an OCV of the target secondary battery; and a state of charge (SOC) estimating step of estimating an SOC of the target secondary battery to be 0%, if an imaginary component of the measurement result of the acquired alternating current impedance at a predetermined frequency within the specific frequency range is greater than or equal to a first threshold value and the acquired OCV value is less than or equal to a second threshold value. As with the embodiments of the battery performance evaluation device as described above, the performance of secondary batteries can be evaluated more appropriately.

DETAILED DESCRIPTION

Figure 1:
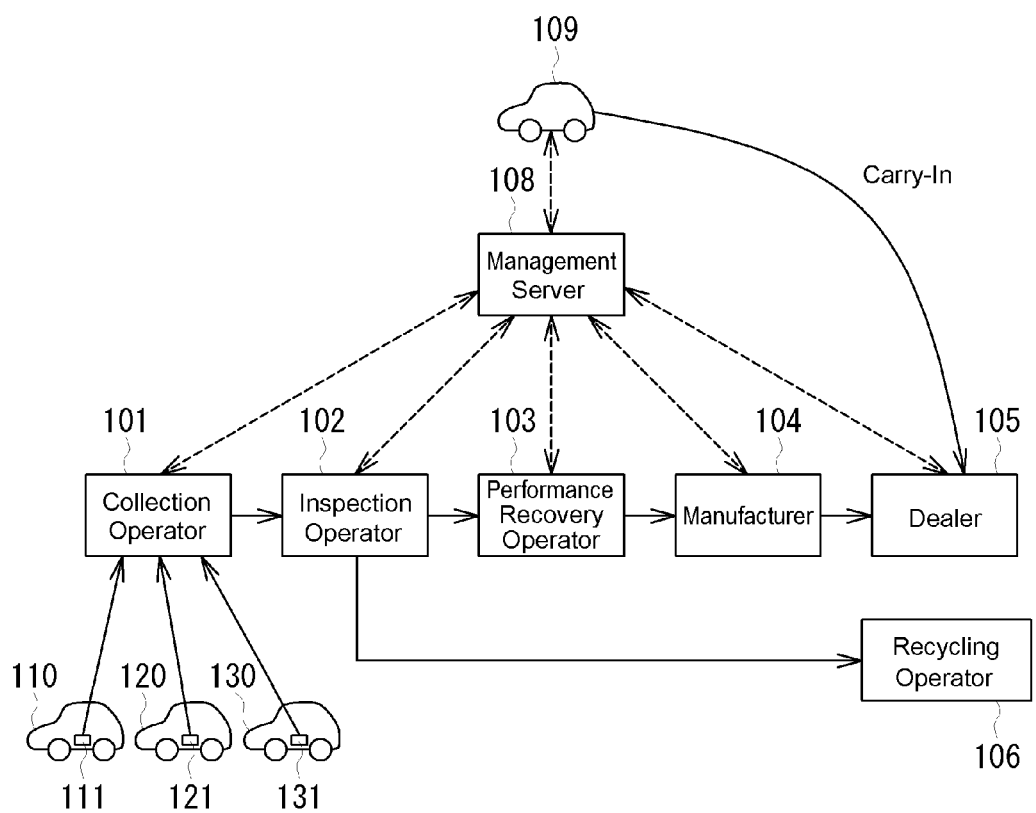
FIG. 1 is a view illustrating an example of logistics of secondary batteries, including collection, manufacturing, and sales of secondary batteries according to the present embodiment.

Hereinbelow, embodiments of the present disclosure will be described in detail with reference to the drawings. It should be noted that the matters not specifically described in this description but necessary to carry out the embodiments can be understood as design variations by a skilled person based on the prior art in the related field. The present invention may be implemented based on the contents disclosed herein and the common general technical knowledge in the related field. Throughout the drawings, identical reference characters and descriptions are used to designate like elements or features. It should be noted that dimensional relationships in the drawings do not necessarily reflect actual dimensional relationships.

The present embodiment describes an example of evaluating the performance of secondary batteries that have been used onboard vehicles. Specifically, in the present embodiment, secondary batteries that have been carried onboard vehicles are collected, then the performance of each of the collected secondary batteries is evaluated, and the policy on how to reuse the secondary battery is determined according to the result of the evaluation. It should be noted, however, that at least part of the technology illustrated in the present disclosure can be applied also to other situations (for example, a situation in which the performance of a secondary battery used in a device other than a vehicle is to be evaluated, or a situation in which the performance of a newly manufactured secondary battery is to be evaluated).

In the present embodiment, the battery pack carried onboard a vehicle includes a plurality of modules. The plurality of modules may be either connected in series or connected in parallel with each other. Each of the modules includes a plurality of battery cells (unit cells) connected in series.

In the present embodiment, a battery pack collected from a vehicle is disassembled into modules, and thereafter, each of the modules is subjected to performance evaluation. As a result of the performance evaluation, the modules that are determined to be reusable are reused (rebuilt) as a part of a newly manufactured battery pack. However, depending on the structure of the battery pack, it is also possible to carry out the performance evaluation in the shape of battery pack without disassembling the battery pack. Furthermore, it is also possible to carry out the performance evaluation for each of the battery cells that make up the module.

In the present embodiment, the secondary battery cell (each of the battery cells that make up the module) is a nickel-metal hydride battery. Specifically, the positive electrode includes nickel hydroxide [$Ni(OH)_2$] containing a cobalt oxide additive. The negative electrode includes a hydrogen-absorbing alloy ($MnNi_5$-based alloy, which is a nickel-based alloy). The electrolyte solution includes potassium hydroxide (KOH). However, this is merely an illustrative example of specific cell structure, and it is possible to apply the technique illustrated in the present disclosure to various other types of secondary batteries.

Battery Logistics Model

With reference to FIG. 1, an embodiment of logistics of secondary batteries, including collection, manufacturing (recycling), and sales of secondary batteries according to the present embodiment will be described. In the example shown in FIG. 1, a collection operator 101 collects used secondary batteries (battery packs) 111, 121, and 131 from vehicles 110, 120, and 130. Although only three vehicles 110, 120, and 130 are illustrated in FIG. 1, secondary batteries are collected from a greater number of vehicles in a real situation. The collection operator 101 disassembles the collected battery packs to obtain a plurality of modules from each of the battery packs. In the example shown in FIG. 1, an identification number is assigned to each of the modules, and the information about each of the modules is managed by a management server 108. The collection operator 101 transmits the identification numbers of the modules obtained from the battery packs to the management server 108 using a terminal device (not shown).

An inspection operator 102 carries out performance evaluation for each of the modules collected by the collection operator 101. For example, the inspection operator 102 assesses at least one electrical characteristic of each of the modules, including the battery capacity (for example, fully charged capacity), the resistance value, the open circuit voltage (OCV), and the state of charge (SOC) of each of the modules. The inspection operator 102 determines a plan for reusing the modules based on the results of the evaluation. For example, the inspection operator 102 separates the modules into reusable modules and non-reusable modules based on the results of the evaluation, and hands over the reusable modules to a performance recovery operator 103 and the non-reusable modules to a recycling operator 106. The results of the performance evaluation for each of the modules is transmitted to a management server 108 by a terminal (not shown) of the inspection operator 102.

The performance recovery operator 103 carries out a process for recovering the performance of the modules that have been determined as reusable by the inspection operator 102. In an example, the performance recovery operator 103 charges the modules to an overcharged state so as to recover the fully charged capacity of the modules. However, it is possible that the performance recovery process by the performance recovery operator 103 may be eliminated for the modules that have been evaluated to have low performance degradation in the performance evaluation by the inspection operator 102. The results of the performance recovery for each of the modules is transmitted to the management server 108 by a terminal (not shown) of the performance recovery operator 103.

A manufacturer 104 manufactures battery packs using the modules of which the performance recovery operator 103 have recovered the performance. For example, the manufacturer 104 may replace a module showing degraded performance in a battery pack of a vehicle 109 with a module of which the performance recovery operator 103 have recovered the performance, to manufacture (rebuild) the battery pack of the vehicle 109.

A dealer 105 may sell the battery packs manufactured by the manufacturer 104 as battery packs for vehicle use or as battery packs for stationary use that may be usable in residential settings. A recycling operator 106 disassembles the modules that have been determined as non-reusable by the inspection operator 102, and recycles the modules for using them as a material for new battery cells or the like.

Note that FIG. 1 depicts the collection operator 101, the inspection operator 102, the performance collection operator 103, the manufacturer 104, the dealer 105, and the recycling operator 106 as different business entities. However, the types of business entities are not limited to the examples shown in FIG. 1. For example, the inspection operator 102 and the performance recovery operator 103 may be the same business entity. Also, the collection operator 101 may be fulfilled by two separate operators, one that collects battery packs and the other that disassembles the collected battery packs. The base locations of the operators and dealers are not limited to specific locations, and a plurality of operators are based at either the same location or different locations.

The following description is provided to illustrate an example in which performance evaluation is performed for a module M that may be contained in battery packs 111, 112, and 113 collected from vehicles 110, 120, and 130, and according to the evaluation result, the policy on how to reuse the module M is determined. That is, in the present embodiment, the target secondary battery, the performance of which is to be evaluated, is a module M.

Battery Performance Evaluation System

Figure 2:
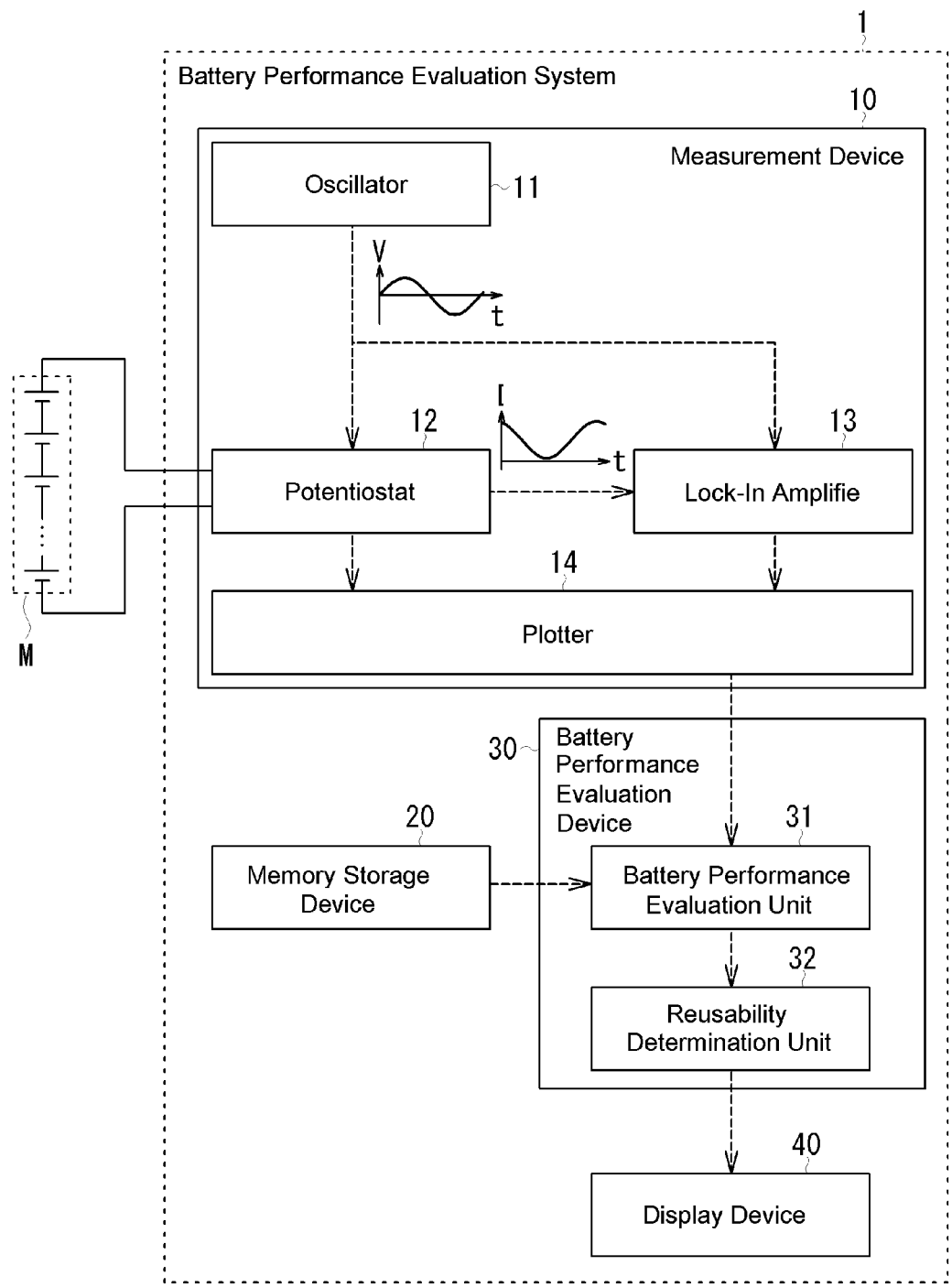
FIG. 2 is a view illustrating a configuration of a battery performance evaluation system 1.

With reference to FIG. 2, a battery performance evaluation system 1 according to the present embodiment will be described. In the battery logistics model shown in FIG. 1, the battery performance evaluation system 1 is provided for the inspection operator 102, for example. The battery performance evaluation system 1 according to the present embodiment includes a measurement device 10, a memory storage device 20, a battery performance evaluation device 30, and a display device 40. These devices may be independent of each other, or two or more of these devices may be combined into one device.

The measurement device 10 measures the OCV of the module M, and outputs the measurement result to the battery performance evaluation device 30. The measurement device 10 also measures the alternating current impedance of the module M, and outputs a Nyquist plot indicating the measurement result to the battery performance evaluation device 30. More specifically, the measurement device 10 of the present embodiment includes an oscillator 11, a potentiostat 12, a lock-in amplifier 13, and a plotter 14.

The oscillator 11 outputs sine waves of the same phase to the potentiostat 12 and the lock-in amplifier 13.

The potentiostat 12 generates an alternating current application signal by superposing a predetermined direct current voltage on an alternating current voltage (for example, a voltage with an amplitude of about 10 mV) that is in the same phase as that of the sine wave output from the oscillator 11, and applies the generated application signal to the module M. The potentiostat 12 detects the electric current flowing through the module M, and outputs the detection result of the electric current to the lock-in amplifier 13 as a response signal from the module M. The potentiostat 12 also outputs the application signal and the response signal to the plotter 14.

The lock-in amplifier 13 compares the phase of the sine wave that is output from the oscillator 11 and the phase of the response signal that is output from the potentiostat 12, and outputs the result of the comparison (i.e., the phase difference between the sine wave and the response signal) to the plotter 14.

The plotter 14 plots the measurement results of the alternating current impedance of the module M onto a complex plane based on the signal from the potentiostat 12 (the signal indicating the amplitude ratio of the application signal and the response signal) and the signal from the lock-in amplifier 13 (the signal indicating the phase difference between the application signal and the response signal). More specifically, the frequency of the sine wave that is output from the oscillator 11 is swept over a predetermined frequency range, and the above-described processes by the potentiostat 12 and the lock-in amplifier 13 are executed repeatedly. Thereby, the measurement results of alternating current impedance of the module M for various frequencies of the sine wave are plotted on a complex plane. The generated plot is referred to as a Nyquist plot (which may be also referred to as a Cole-Cole plot). The Nyquist plot of the module M is output to the battery performance evaluation device 30.

It should be noted that the configuration of the measurement device 10 is not limited to that illustrated in FIG. 2. For example, it is described that the potentiostat 12 of the present embodiment applies an alternating current voltage to the module M and detects the electric current passing through the module M while applying the voltage. However, it is also possible that the potentiostat 12 may detect a voltage response while applying an alternating current to the module M. It is also possible that the measurement device 10 may include a frequency response analyzer in place of the lock-in amplifier 13.

Furthermore, it is also possible to modify the technique of the alternating current impedance measurement. For example, it is also possible that the measurement device 10 may generate an application signal containing various frequency components within a predetermined frequency range (either one of voltage signal or current signal) and it may detect the response signal (the other one of voltage signal or current signal) while applying the application signal. It is also possible that the measurement device 10 may calculate an alternating current impedance for each of the frequencies by performing a fast Fourier transform on each of the application signal and the response signal.

The memory storage device 20 stores a pre-trained neural network model that causes the battery performance evaluation device 30 to execute a process of estimating a battery capacity (a fully charged capacity in the present embodiment) of the module M. In response to a request from the battery performance evaluation device 30, the memory storage device 20 executes processes such as learning of the neural network model, updating of learning results, and outputting of the learning results to the battery performance evaluation device 30.

The battery performance evaluation device 30 includes a controller (for example, a CPU), a memory, and input/output ports. Specifically, the battery performance evaluation device 30 is provided with the functions of a battery performance evaluation unit 31 and a reusability determination unit 32. Although the details will be described later, the battery performance evaluation unit 31 estimates whether or not the SOC of the module M is 0% based on, for example, the OCV value of the module M that has been measured by the measurement device 10. This process is referred to as an "SOC estimating process" in the present embodiment. The battery performance evaluation unit 31 also estimates the battery capacity (the fully charged capacity in the present embodiment) of the module M based on the alternating current impedance of the module M that has been measured by the measurement device 10. This process is referred to as a "battery capacity estimating process" in the present embodiment. The reusability determination unit 32 determines how the module M is reused according to the evaluation result of the performance of the module M. The reusability determination unit 32 may determine whether or not the module M can be reused.

The display device 40 is composed of a liquid crystal display, for example, to display the evaluation result of the performance of the module M and the determination result of how to reuse the module M, which are obtained by the battery performance evaluation device 30. Thus, the inspection operator can determine what kind of process should be performed for the module M.

Nyquist Plot

Figure 3:
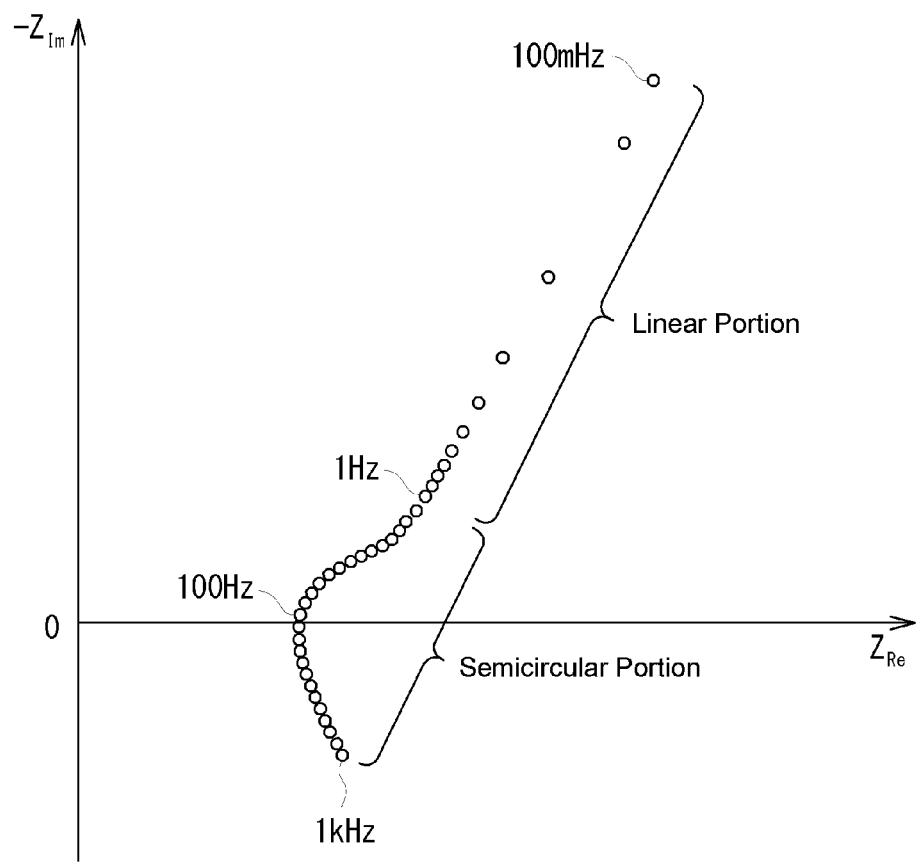
FIG. 3 is a graph illustrating an example of a Nyquist plot that shows the results of an alternating current impedance measurement for a module M.

With reference to FIG. 3, a Nyquist plot showing the results of an alternating current impedance measurement for a module M will be described. In FIG. 3, the horizontal axis represents the real component ($Z_{Re}$) of the alternating current impedance (complex impedance) of the module M, and the vertical axis represents the imaginary component ($-Z_{Im}$) of the alternating current impedance of the module M.

The measurement device 10 of the present embodiment applies application signals with various frequencies in the range of 100 mHz to 1 kHz to the module M. Since the signals with various frequencies are applied to the module M, the measurement results of alternating current impedance of the module M, which correspond to the frequencies of the signals, are plotted on a complex plane as discrete values, as shown in FIG. 3. Specifically, application signals with 52 different frequencies in the frequency range of 100 mHz to 1 kHz are used in the present embodiment. As a result, the resulting Nyquist plot has a semi-circular portion, which is obtained from application signals at high frequencies (from 1 Hz to 1 kHz in the example shown in FIG. 3), and a linear portion, which is obtained from application signals at low frequencies (from 100 mHz to 1 Hz).

The battery capacity estimating process of the present embodiment uses a neural network model in order to estimate the battery capacity (the fully charged capacity in the present embodiment) of the module M. Machine learning of the neural network model is performed so that, when a measurement result of alternating current impedance is fed into the input layer of the neural network model, a highly accurate estimation result of battery capacity is output from the output layer of the neural network model.

Estimation of SOC

Figure 4:
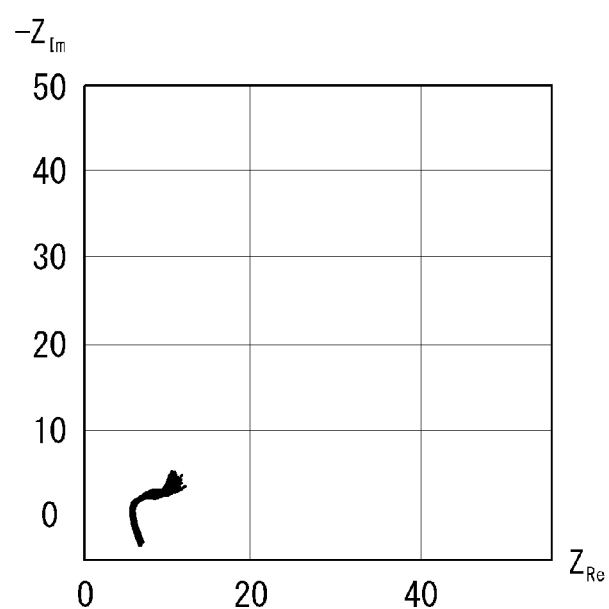
FIG. 4 is a graph illustrating Nyquist plots of a plurality of modules M with an SOC of from greater than 0% to less than 20%.
Figure 5:
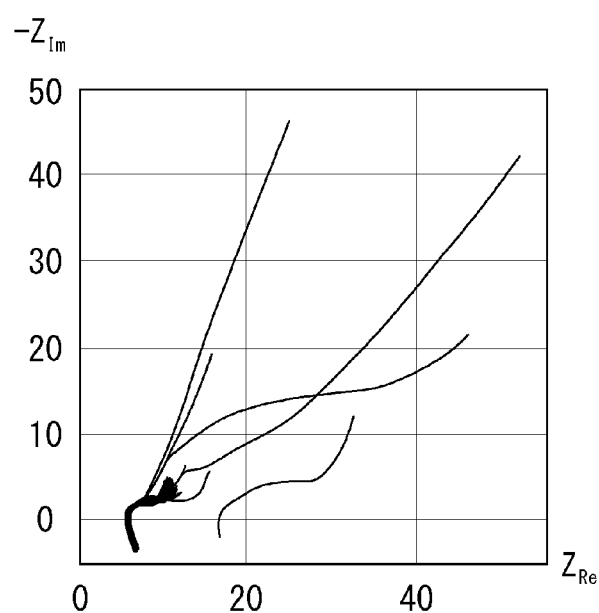
FIG. 5 is a graph illustrating Nyquist plots of a plurality of modules M having an SOC of 0%.
Figure 6:
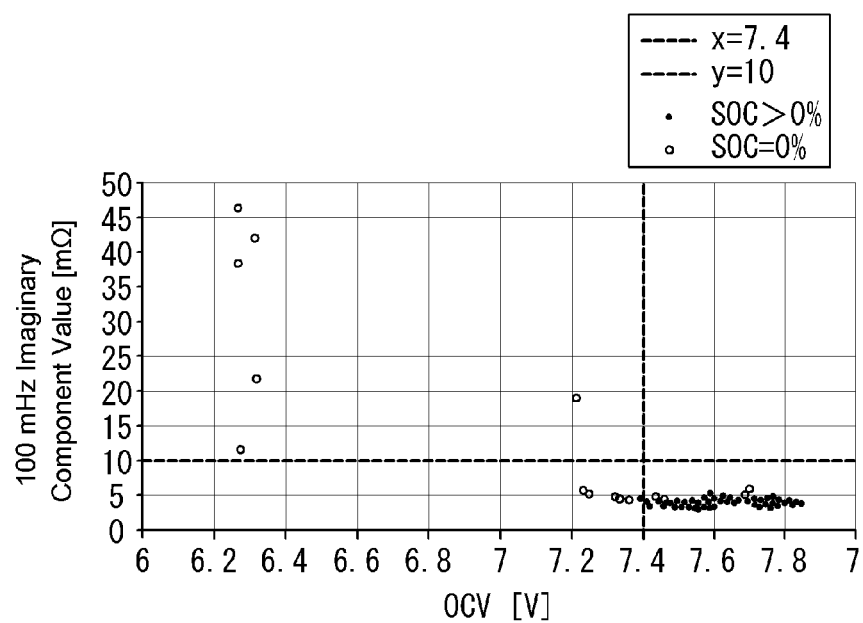
FIG. 6 is a graph illustrating the relationship between 100 mHz imaginary components and OCVs of a plurality of modules M.

With reference to FIGS. 4 to 6, the relationship between the SOC, the imaginary component of the alternating current impedance, and the OCV of the module M will be described. The inventors of the present application have discovered that at least one of the value of the imaginary component of the alternating current impedance at a predetermined frequency and the value of the OCV is likely to be different between a secondary battery having an SOC of 0% and a secondary battery having an SOC of greater than 0%. According to the just-mentioned knowledge, the SOC estimating process of the present embodiment estimates whether the SOC of a module M is 0% or not. It is believed that the modules M having an SOC of 0% are highly likely to have defects such as micro-short circuit and therefore not suitable for reuse (rebuild).

FIG. 4 shows Nyquist plots of a plurality of modules M that have an SOC of greater than 0% to less than 20%. FIG. 5 shows Nyquist plots of a plurality of modules M that has an SOC of 0%. As illustrated in FIG. 4, when the SOC is greater than 0% to less than 20%, the imaginary component $-Z_{Im}$ values of the alternating current impedances are less than a predetermined first threshold value (10 mΩ in the example shown in FIG. 4). Although not shown in the drawings, when the SOC was greater than or equal to 20% as well, the imaginary component $-Z_{Im}$ values of the alternating current impedances were found to be less than the predetermined first threshold value. On the other hand, as illustrated in FIG. 5, the modules M having an SOC of 0% showed, in a certain proportion or more, that the imaginary component values resulting from an application signal at a predetermined frequency (in a low frequency range, 100 mHz to about 1 Hz in the example shown in FIG. 5) were greater than or equal to the first threshold value. From the above-described results, it will be appreciated that whether or not the SOC of a module M is 0% can be estimated by comparing the imaginary component value of the alternating current impedance in the case where the application signal is at a predetermined frequency with the first threshold value.

In the examples shown in FIGS. 4 and 5, all the Nyquist plots show that the lower the frequency of the application signal, the greater the imaginary component value, in a low frequency range (100 mHz to about 1 Hz) of the application signal's frequency range (100 mHz to 1 kHz). Accordingly, in the present embodiment, the imaginary component value at the lowest frequency (100 mHz) within the frequency range of the application signal is compared with the first threshold value, to estimate whether the SOC of the module M is 0% or not. However, in the examples shown in FIGS. 4 and 5, it is also possible that an imaginary component value at a frequency other than the lowest frequency in the low frequency range (100 mHz to about 1 Hz) may be compared with the first threshold value. Moreover, it is also possible that imaginary component values at a plurality of frequencies within the low frequency range may be compared with the first threshold value.

FIG. 6 is a graph illustrating the relationship between 100 mHz imaginary components (i.e., the imaginary components of alternating current impedances in the case where the application signal is at 100 mHz) and OCVs of a plurality of modules M. As described previously, many of the 100 mHz imaginary components of modules M having an SOC of 0% are greater than or equal to the first threshold value, 10 mΩ.

In addition, as illustrated in FIG. 6, when the SOC of the module M is greater than 0%, almost all the OCV values are greater than a second threshold value (7.4 V in the example shown in FIG. 6). On the other hand, when the SOC of the module M is 0%, many of the OCV values are less than or equal to the second threshold value. From the above-described results, it will be appreciated that whether or not the SOC of a module M is 0% can be estimated by comparing the OCV value of the module M with the second threshold value.

It should be noted it is possible to estimate whether or not the SOC of a module M is 0% to a certain degree even when only one of the imaginary component at a predetermined frequency and the OCV is compared with a threshold value. However, as illustrated in FIG. 6, the accuracy in the estimation increases by conducting both the comparison of the imaginary component at a predetermined frequency with the first threshold value and the comparison of the OCV with the second threshold value. Thus, the present embodiment estimates whether the SOC of the module M is 0% or not by comparing both the imaginary component of the module M at a predetermined frequency and the OCV of the module M with respective threshold values.

Each of the Nyquist plots illustrated in FIGS. 4 and 5 is a Nyquist plot of a module M that includes six series-connected battery cells each composed of the previously-described nickel-metal hydride battery. However, the tendency of distribution of Nyquist plots varies depending on conditions such as the type of the secondary battery, whether or not the secondary battery is a battery pack or a module, and the battery structure if the secondary battery is a battery pack or a module. Therefore, in the frequency range of the application signal, the range of the predetermined frequency that corresponds to the imaginary component to be compared with the first threshold value may be changed depending on conditions such as the type of the secondary battery and so forth.

In addition, in the present embodiment, the first threshold value is set to 10 mΩ based on the experimental results shown in FIGS. 4 to 6. Furthermore, in the present embodiment, the second threshold value is set to 7.4 V based on the experimental results shown in FIG. 6. However, the first threshold value varies depending on the conditions such as the type of the secondary battery and so forth, and depending on a predetermined frequency corresponding to the imaginary component to be compared with the first threshold value. Likewise, the second threshold value also varies depending on the conditions such as the type of the secondary battery and so forth. Therefore, the first threshold value and the second threshold value may also be determined as appropriate depending on various conditions such as the type of the secondary battery and so forth.

Two-Group Classification

Figure 7:
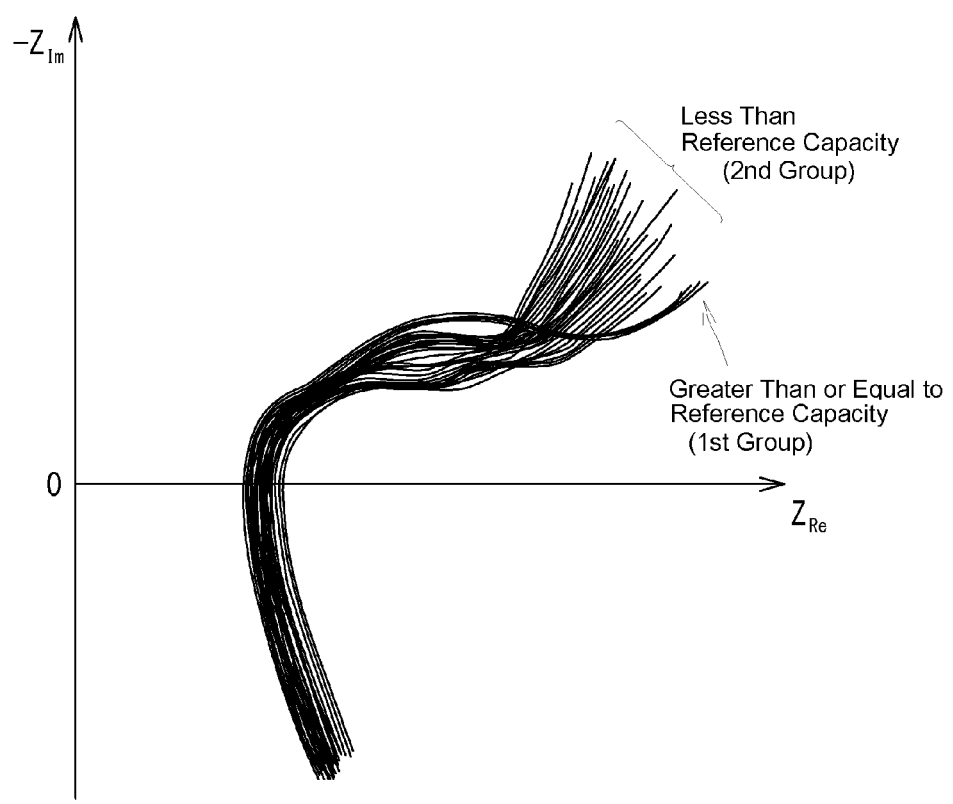
FIG. 7 is a graph illustrating Nyquist plots of a plurality of modules M that have different fully charged capacities.
Figure 8:
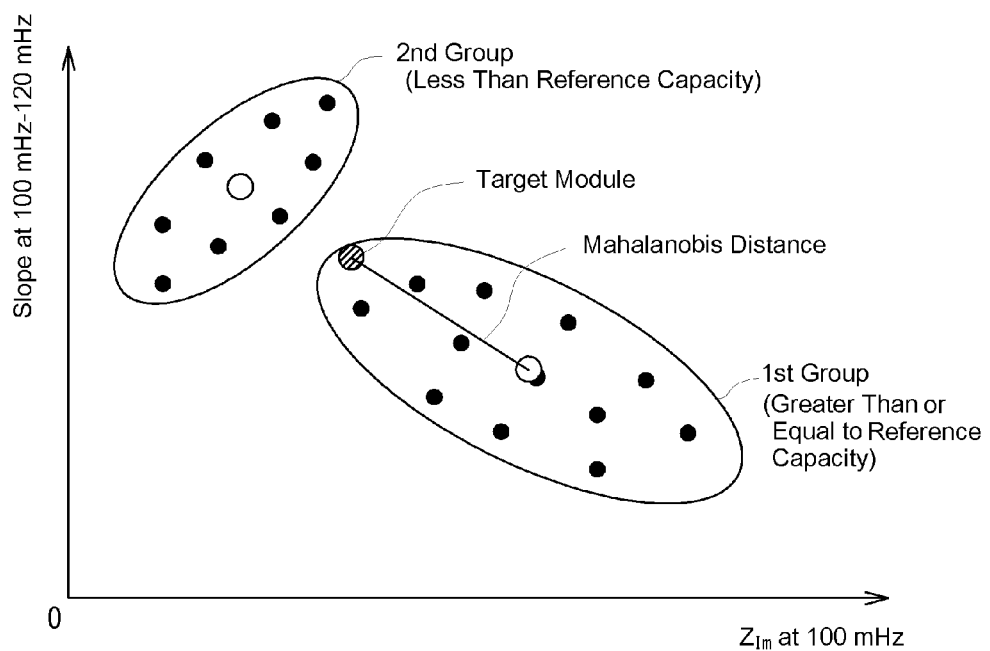
FIG. 8 is a view for illustrating two-group classification in the present embodiment.

With reference to FIGS. 7 and 8, two-group classification for modules M will be described. The two-group classification refers to classifying a module M into which one of a first group, in which the battery capacity (the fully charged capacity in the present embodiment) is within a reference range, and a second group, in which the battery capacity is outside the reference range. From the observation of Nyquist plots of a plurality of secondary batteries (modules M in the present embodiment) with various battery capacities, the inventors of the present disclosure have discovered that the shape of the linear portion of a Nyquist plot (see FIG. 3) shows a different tendency between when the battery capacity is within a specific range and when outside the specific range. Hereinbelow, the specific range of battery capacity is referred to as "reference range", and the lower limit of the reference range is referred to as "reference capacity". In the present embodiment, the reference range is from 3 Ah to 7 Ah, and the reference capacity is 3 Ah, for example.

FIG. 7 shows Nyquist plots of a plurality of modules M that have different fully charged capacities. As illustrated in FIG. 7, in the present embodiment, the ends of the linear portions of the Nyquist plots of the modules M that have a fully charged capacity within the reference range are located in a lower area in the figure than those of the Nyquist plots of the modules M that have a fully charged capacity outside the reference range. That is, when comparing the imaginary components of alternating current impedances in a low frequency range (particularly at the lowest frequency, 100 mHz), the imaginary components of the modules M having a fully charged capacity within the reference range are less than the imaginary components of the modules M having a fully charged capacity outside the reference range. In addition, it is seen that the Nyquist plots of the modules M that have a fully charged capacity within the reference range have a smaller slope in the linear portion (particularly the linear portion obtained from application signals at 100 mHz to 120 mHz) than the Nyquist plots of the modules M that have a fully charged capacity outside the reference range. From the above discussion, it is demonstrated that whether or not the battery capacity (the fully charged capacity in the present embodiment) of a module M is greater than or equal to the reference capacity can be determined by extracting, as a feature value, the imaginary component of the alternating current impedance at an end of the linear portion and the slope of the linear portion from the Nyquist plot of the module M. Note that the modules M having a battery capacity of less than the reference capacity are considered to be excessively deteriorated and not suitable for reuse (rebuild).

With reference to FIG. 8, an example of the two-group classification will be described. In FIG. 8, the horizontal axis represents the imaginary component of alternating current impedance at an end (100 mHz, the lowest frequency in the frequency range of the application signal) of the linear portion of the Nyquist plot, and the vertical axis represents the slope of the linear portion in the low frequency range (from 100 mHz to 120 mHz). In FIG. 8, each of the black dots plotted in the figure represents a feature value that is the result of extracting the slope of the linear portion and the imaginary component of the alternating current impedance at the end of the linear portion from each of the Nyquist plots of a plurality of modules M having different actually measured fully charged capacities. Each of the plot points belongs to either the first group or the second group according to whether or not the actually measured fully charged capacity is greater than or equal to the reference capacity. A group of plot points that are obtained from the modules M with an actually measured fully charged capacity of greater than or equal to the reference capacity belongs to the "first group". A group of plot points that are obtained from the modules M with an actually measured fully charged capacity of less than the reference capacity belongs to the "second group".

To classify a module M (hereinafter referred to as a "target module"), the battery capacity (the fully charged capacity in the present embodiment) of which is unknown, into which one of the first group and the second group, the above-described two feature values are first extracted from the Nyquist plot of the target module. The extracted feature values are compared with the feature values of a plurality of modules M, the battery capacity of which are known, so that the target module can be classified.

As an example, a Mahalanobis-Taguchi method (MT method) is employed as the technique of two-group classification in the present embodiment. In this case, the Mahalanobis distance between the plot point indicating the two feature values of the target module and the plot point group representing the first group is calculated. In the example shown in FIG. 8, the Mahalanobis distance is represented by the distance between the plot point of the target module (see the hatched dot) and the plot point that is located inside (near the center) the plot point group representing the first group (see the white dot). Because the equation for calculating the Mahalanobis distance is known per se, the detailed description thereof will be omitted.

It is also possible to modify the specific method of two-group classification. For example, it is possible to calculate both the Mahalanobis distance between the target module and the first group and the Mahalanobis distance between the target module and the second group and compare the two calculated Mahalanobis distances, to carry out the two-group classification. It is also possible to use a technique other than the Mahalanobis-Taguchi method (for example, a linear discrimination technique) for the two-group classification.

Neural Network Learning

Figure 9:
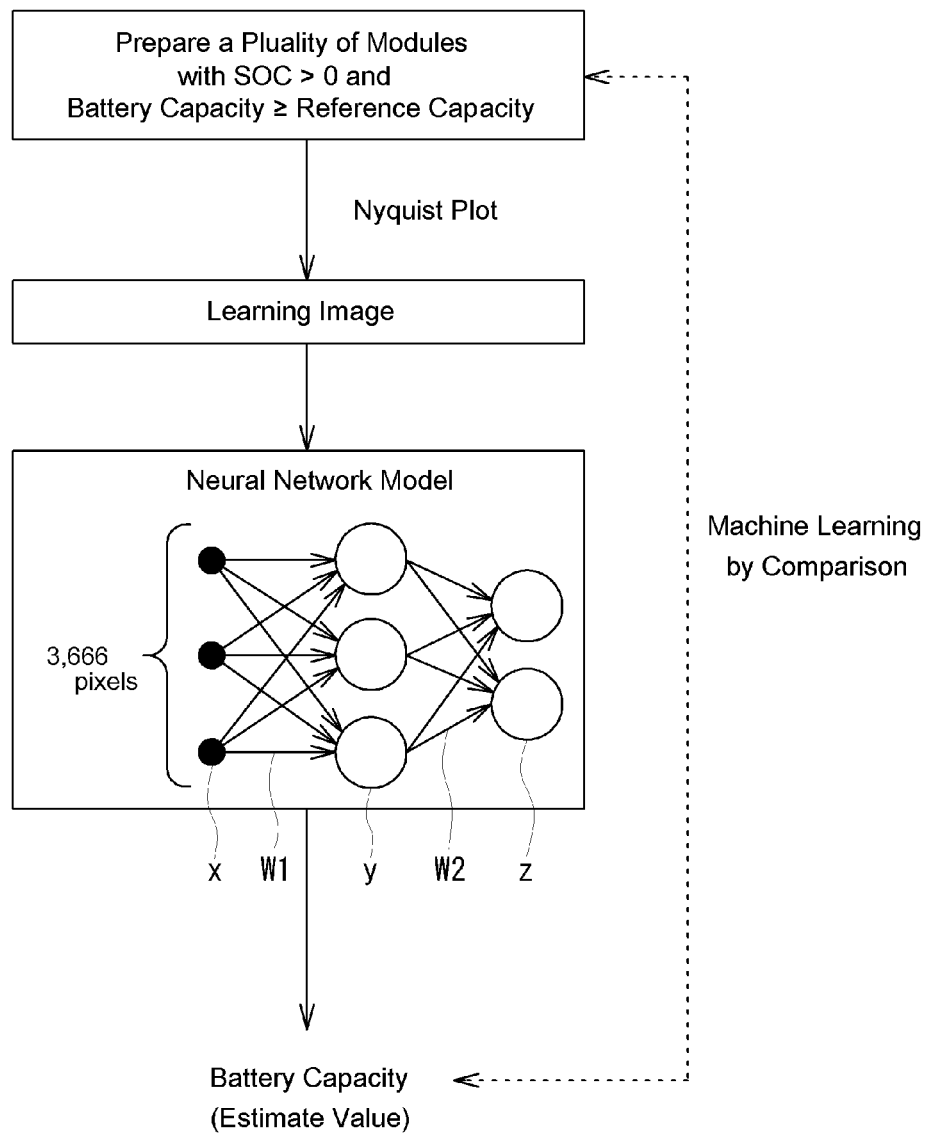
FIG. 9 is a schematic illustrative drawing for illustrating learning of a neural network model in the present embodiment.

With reference to FIG. 9, learning of a neural network model that is used for estimating the battery capacity of a module M will be described. First, an example of the neural network model is described. The neural network model in the present embodiment includes, for example, an input layer x, a hidden layer y, and an output layer z. The weighting between the input layer x and the hidden layer y is denoted as W1, and the weighting between the hidden layer y and the output layer z is denoted as W2. The neural network model of the present embodiment is trained using training data including input training data, which are the data relating to the alternating current impedances of the modules M, and output training data, which are the data relating to the actual battery capacities of the modules M. The actual battery capacity of a module M may be either an actual measurement value of battery capacity of the module M or an estimate value that has been estimated with high accuracy. For example, the actual measurement value of the fully charged capacity of a module M can be obtained by, for example, measuring the amount of charge required for charging the module M from the fully discharged state to the fully charged state.

The learning method of the neural network model in the present embodiment will be described below. First, the modules M having an SOC of 0%, and the modules M that are estimated to have an SOC of 0%, are excluded from a plurality of candidates for modules M of which the actual battery capacity (the fully charged capacity in the present embodiment) is known. For example, a known technique may be used to measure the SOC values of the modules M, to exclude the modules having an SOC value of 0% from the candidates. It is also possible that, according to the previously-described SOC estimation algorithm, a module M that has an imaginary component at a predetermined frequency that is greater than or equal to the first threshold value and an OCV value of less than or equal to the second threshold value may be estimated to be a module M having an SOC of 0% and excluded from the candidates. Because the modules having an SOC of 0% are excluded from the target secondary batteries used to obtain the training data, the trained neural network model is optimized for the battery capacity estimation of a module M having an SOC of greater than 0%.

Also, those modules M that have an actual battery capacity outside the above-mentioned reference range (i.e., less than the reference capacity) are excluded from the plurality of candidates for the modules M. As a result, the trained neural network model is optimized for estimating the battery capacity of a module M having a battery capacity within the reference range (i.e., a module M that belongs to the first group).

Next, a Nyquist plot is obtained from the measurement results of the alternating current impedances of those modules M that have an SOC of greater than 0% and an actual battery capacity of greater than or equal to the reference capacity. The data of learning image based on the obtained Nyquist plot are generated as input training data. The learning image of the present embodiment includes, for example, a region including 47 vertical pixels and 78 horizontal pixels, a total of 3,666 pixels. In the learning image, each of all the 3,666 pixels contains the information indicating whether or not it matches any of the alternating current impedance measurement results (Nyquist plots) at 52 different frequencies. Therefore, the effect of learning is stronger than the case where the alternating current impedance measurement results at 52 different frequencies are used as the input training data. As a result, the accuracy of estimation of the battery capacity is improved. It should be noted that the input layer x of the neural network model includes 3,666 nodes, which correspond to the 3,666 pixels. In addition, it is possible that the specific form of the learning image and the later-described estimation image may be modified. For example, instead of using the image of the Nyquist plot which contains a plurality of plot points in itself, it is possible to use an image containing a line or a region that is generated based on the plurality of plot points as the learning image and the estimation image. Alternatively, it is also possible to employ data other than image data (for example, the data of the Nyquist plot per se) as the data to be input into the neural network model.

Next, learning of the neural network model is conducted using the data of the learning image obtained from a module M as the input training data, and using the data of the actual battery capacity of the same module M as the output training data. More specifically, the present embodiment supplies learning image data to the input layer x of the neural network model, and acquires a battery capacity estimate value that is output from the output layer z. The acquired battery capacity estimate value is compared with the actual battery capacity, and the result of the comparison is fed back as a training signal to the neural network model. According to the training signal, the weightings W1 and W2 of the neural network model are adjusted. As the above-described procedure is repeated using a plurality of training data, the accuracy of estimation of the battery capacity is improved correspondingly.

Battery Performance Evaluating Process

Figure 10:
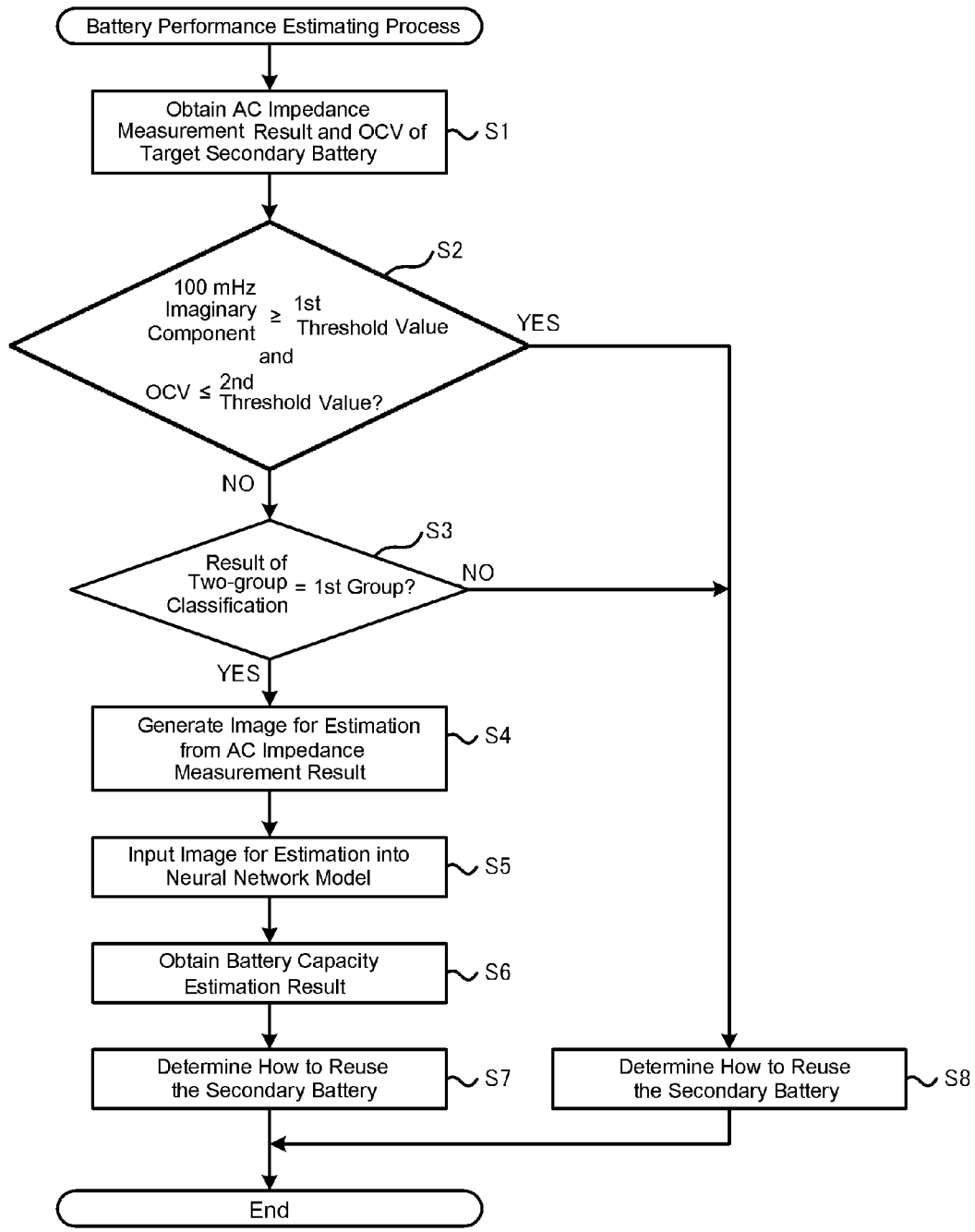
FIG. 10 is a flow-chart illustrating a battery performance evaluation process according to the present embodiment.

With reference to FIG. 10, a battery performance evaluating process executed by the battery performance evaluation device 30 will be described. The battery performance evaluating process of the present embodiment is executed by a control unit (for example, a controller such as CPU) included in the battery performance evaluation device 30. For example, when a start instruction for battery performance evaluation is input by an operating unit (not shown), the control unit of the battery performance evaluation device 30 executes the battery performance evaluating process illustrated in FIG. 10. Each of the steps of the battery performance evaluation process is basically implemented by software processing by the control unit. However, at least part of the process may be implemented by hardware (e.g., electric circuit). In addition, at least part of the process may be implemented by a device other than the battery performance evaluation device 30 (for example, the measurement device 10) of the battery performance evaluation system 1. It should be noted that the battery performance to be evaluated in the present embodiment includes whether the SOC of the module M is 0% or not, and the battery capacity of the module M.

First, the control unit obtains the measurement result of the alternating current impedance and the OCV of the module M that is the target of the performance evaluation (hereinafter referred to as the "target secondary battery"). As described previously, the alternating current impedance and the OCV of the target secondary battery are measured by the measurement device 10.

The control unit judges whether both of the condition that the imaginary component of the alternating current impedance at a predetermined frequency (100 mHz in the present embodiment) is greater than or equal to a first threshold value and the condition that the OCV value is less than or equal to a second threshold value are satisfied (S2). As described previously, when both of the two conditions are satisfied (S2: YES), it is estimated that the SOC of the target secondary battery is 0%. If this is the case, it is highly likely that the target secondary battery has a defect such as micro-short circuit. Therefore, the control unit does not estimate the battery capacity of the target secondary battery, and determines that the target secondary battery is not suitable for reuse (rebuild) (S8), so the process ends.

If at least one of the two conditions in S2 is not satisfied (S2: NO), it is estimated that the SOC of the target secondary battery is not 0%. If this is the case, the control unit extracts the above-mentioned feature values (i.e., the imaginary component of the alternating current impedance at the end of the linear portion and the slope of the linear portion) from the Nyquist plot of the target secondary battery. The control unit classifies the target secondary battery into either the first group or the second group based on the extracted feature values (S3). As described previously, if the target secondary battery is classified into the second group (S3: NO), it is highly likely that the battery capacity of the target secondary battery is less than the reference capacity due to excessive deterioration, for example. Therefore, the control unit does not estimate the battery capacity of the target secondary battery, and determines that the target secondary battery is not suitable for reuse (rebuild) (S8), so the process ends.

If the target secondary battery is classified into the first group (S3: YES), the control unit generates an estimation image for estimating the battery capacity from the Nyquist plot showing the measurement results of the alternating current impedance of the target secondary battery (S4). The technique for generating the estimation image is similar to the above-described technique for generating the learning image. The control unit inputs the generated estimation image into the input layer x (see FIG. 9) of the pre-trained neural network model (S5). The control unit acquires the result of estimation of battery capacity, which is output from the output layer z (S6). Based on the acquired result of estimation of battery capacity, the control unit determines how to reuse the target secondary battery (S7). Then, the process ends.

Note that the process of acquiring a measurement result of an alternating current impedance of the target secondary battery at S1 in FIG. 10 is an example of the "alternating current impedance acquiring process". The process of acquiring the OCV of the target secondary battery at S1 is an example of the "OCV acquiring process". The process of estimating the SOC of the target secondary battery at S2 is an example of the "SOC estimating process". The process of executing the two-group classification at S3 is an example of the "classifying process". The process of estimating the battery capacity of the target secondary battery at S4 to S6 is an example of the "battery capacity estimating process".

Evaluation Results

The evaluation results of the accuracy of the battery capacity evaluation in the case of executing the SOC estimating process (S2 in FIG. 10) will be described with reference to FIGS. 11 and 12. Both FIGS. 11 and 12 show the results of comparison between estimate values of battery capacity (fully charged capacity in the present embodiment) of target secondary batteries that are obtained using the pre-trained neural network model and actual battery capacities thereof.

Figure 11:
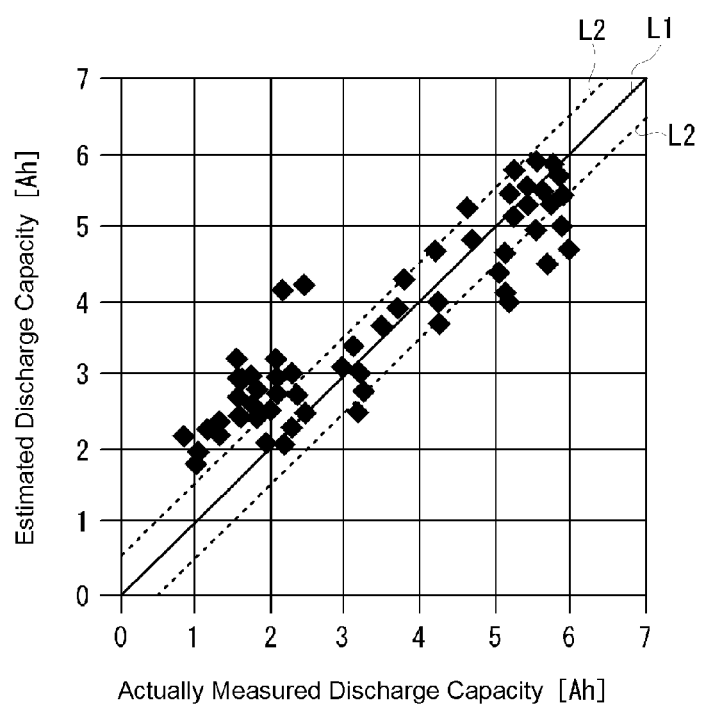
FIG. 11 is a view illustrating an example of battery capacity estimation results when an SOC estimating process is not performed.

Herein, the battery capacity estimate values shown in FIG. 11 are the estimate values that are obtained when neither the SOC estimating process (S2 in FIG. 10) nor the classifying process (S3 in FIG. 10) is executed but only the battery capacity estimating process (S4 to S6 in FIG. 10) is executed. The neural network model used for obtaining the estimate values shown in FIG. 11 is trained using a plurality of training data including the training data of the secondary batteries that have an SOC of 0%. On the other hand, the battery capacity estimate values shown in FIG. 12 are the estimate values that are obtained when the battery capacity estimating process (S4 to S6 in FIG. 10) is executed for the secondary batteries that have been estimated not to have an SOC of 0% by the SOC estimating process (S2 in FIG. 10). The neural network model used for obtaining the estimate values shown in FIG. 12 is trained using only the training data of a plurality of secondary batteries that do not have an SOC of 0%. Note that, in order to eliminate the effect resulting from the classifying process (S3 in FIG. 10) and evaluate only the effect resulting from the SOC estimating process, the classifying process is also omitted in the process of acquiring the battery capacity estimate values shown in FIG. 12.

Figure 12:
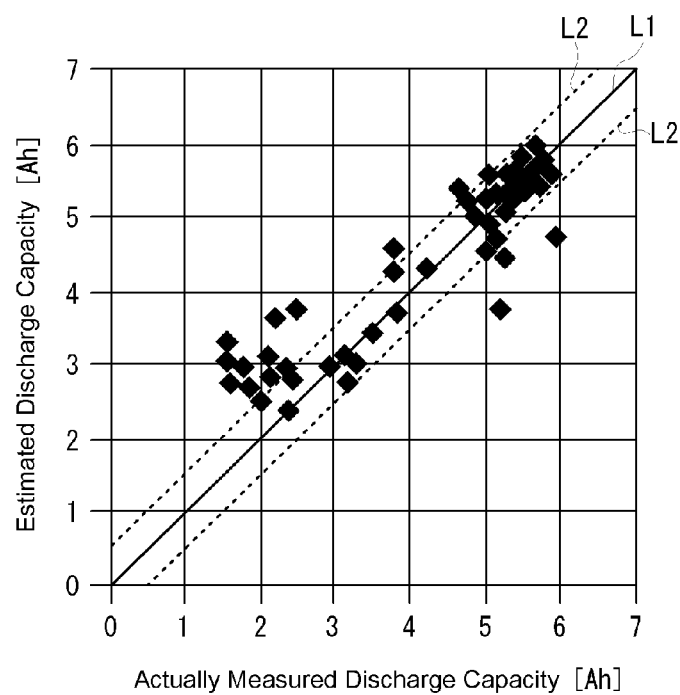
FIG. 12 is a view illustrating an example of battery capacity estimation results when an SOC estimating process is performed.

In FIGS. 11 and 12, the straight line L1 indicates the state in which estimate values and actual measurement values of fully charged capacity are precisely in agreement with each other. Also, the area sandwiched by the two straight lines L2 (referred to as a "matching area") indicates the state in which the errors of the estimate values fall within a predetermined range (within ±0.5 Ah in this case) with respect to the actual measurement values of the fully charged capacity. In the present disclosure, the proportion of the estimate values that fall within the matching area of all the battery capacity estimate values for the respective ones of a plurality of secondary batteries is referred to as a capacity estimation accuracy. When comparing FIGS. 11 and 12, it is seen that the proportion of the estimate values that fall within the matching area is higher in FIG. 12 than that in FIG. 11. The capacity estimation accuracy was actually calculated. As a result, the capacity estimation accuracy in FIG. 11 was found to be 82.29%, and the capacity estimation accuracy in FIG. 12 was 96.96%. The above discussion demonstrates that the accuracy of estimation of battery capacity is improved by executing the SOC estimating process. It is also demonstrated that the SOC estimating process can properly estimate whether the SOC of a secondary battery is 0% or not.

The techniques disclosed in the foregoing embodiments are merely examples. Therefore, it is possible to modify the techniques exemplified in the foregoing embodiments. First, it is possible to implement only some of the plurality of techniques exemplified in the foregoing embodiments. For example, it is possible to omit the two-group classification process (S3) from the battery performance evaluation process shown in FIG. 10. When this is the case, the plurality of training data used for the neural network model learning may include the training data of the secondary batteries that have a battery capacity outside the reference range. In the battery performance evaluating process illustrated in FIG. 10, the battery capacity estimating process (S4 to S6) is executed for the secondary batteries that have been estimated not to have an SOC of 0% by the SOC estimating process (S2). However, it is also possible to execute only the SOC estimating process when, for example, it is sufficient to only estimate whether the SOC is 0% or not.

Although various embodiments of the present disclosure have been described in detail hereinabove, it should be understood that the foregoing embodiments are merely exemplary and are not intended to limit the scope of the claims. Various modifications and alterations of the embodiments described hereinabove are within the scope of the invention as defined by the appended claims.

What is claimed is:

1. A battery performance evaluation device configured or programmed to execute:
   an alternating current impedance acquiring process of acquiring a measurement result of an alternating current impedance of a target secondary battery, the alternating current impedance measured by applying an application signal to the target secondary battery within a specific frequency range;
   an open circuit voltage (OCV) acquiring process of acquiring an OCV of the target secondary battery;
   a state of charge (SOC) estimating process of estimating an SOC of the target secondary battery to be 0%, if an imaginary component of the measurement result of the acquired alternating current impedance at a predetermined frequency within the specific frequency range is greater than or equal to a first threshold value and the acquired OCV value is less than or equal to a second threshold value;
   if the SOC of the target secondary battery is not estimated to be 0% by the SOC estimating process, a battery capacity estimating process of estimating a battery capacity of the target secondary battery based on the measurement result of the alternating current impedance of the target secondary battery; and
   a classifying process of classifying the target secondary battery into either a first group in which the battery capacity is within a reference range or a second group in which the battery capacity is outside the reference range, based on at least one feature value extracted from a Nyquist plot indicating the measurement result of the alternating current impedance of the target secondary battery, and wherein:
   the battery capacity estimating process is executed if the SOC of the target secondary battery is not estimated to be 0% by the SOC estimating process and the target secondary battery is classified into the first group by the classifying process.

2. The battery performance evaluation device according to claim 1, wherein the predetermined frequency of the imaginary component of the alternating current impedance that is to be compared with the first threshold value is contained within a predetermined low frequency range of the specific frequency range.

3. The battery performance evaluation device according to claim 1, wherein:
   the battery capacity estimating process obtains an estimation result of the battery capacity of the target secondary battery by inputting data based on a Nyquist plot of the target secondary battery into a pre-trained neural network model; and
   the pre-trained neural network model performs learning using a plurality of training data including data based on Nyquist plots indicating measurement results of alternating current impedance of a plurality of secondary batteries and actual battery capacities of the plurality of secondary batteries.

4. The battery performance evaluation device according to claim 3, wherein the pre-trained neural network model is trained based on the training data of a plurality of secondary batteries having an SOC of greater than 0%, or a plurality of secondary batteries estimated to have an SOC of greater than 0%.

5. A battery performance evaluation method, comprising:
   an alternating current impedance acquiring step of acquiring a measurement result of an alternating current impedance of a target secondary battery, the alternating current impedance measured by applying an application signal to the target secondary battery within a specific frequency range;
   an open circuit voltage (OCV) acquiring step of acquiring an OCV of the target secondary battery; and
   a state of charge (SOC) estimating step of estimating an SOC of the target secondary battery to be 0%, if an imaginary component of the measurement result of the acquired alternating current impedance at a predetermined frequency within the specific frequency range is greater than or equal to a first threshold value and the acquired OCV value is less than or equal to a second threshold value;
   if the SOC of the target secondary battery is not estimated to be 0% by the SOC estimating step, a battery capacity estimating step of estimating a battery capacity of the target secondary battery based on the measurement result of the alternating current impedance of the target secondary battery; and
   a classifying step of classifying the target secondary battery into either a first group in which the battery capacity is within a reference range or a second group in which the battery capacity is outside the reference range, based on at least one feature value extracted from a Nyquist plot indicating the measurement result of the alternating current impedance of the target secondary battery, and wherein:
   the battery capacity estimating step is executed if the SOC of the target secondary battery is not estimated to be 0% by the SOC estimating step and the target secondary battery is classified into the first group by the classifying step.

* * * * *